US010713403B1

(12) United States Patent
Agrawal et al.

(10) Patent No.: US 10,713,403 B1
(45) Date of Patent: Jul. 14, 2020

(54) SELECTIVELY BYPASSING DESIGN PROCESS STEPS FOR A REGISTER-TRANSFER LOGIC (RTL) DESIGN IN AN ELECTRONIC DESIGN AUTOMATION (EDA) DEVELOPMENT ENVIRONMENT

(71) Applicant: Xilinx, Inc., San Jose, CA (US)

(72) Inventors: Shreegopal S. Agrawal, Hyderabad (IN); Jaipal R. Nareddy, Hyderabad (IN); Suman Kumar Timmireddy, Hyderabad (IN); Benjamin D. Curry, Midlothian (GB); Siddharth Rele, Navi Mumbai (IN); Sozon Panou, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/374,494

(22) Filed: Apr. 3, 2019

(51) Int. Cl.
| | |
|---|---|
| *G06F 30/30* | (2020.01) |
| *G06F 30/20* | (2020.01) |
| *G06F 30/31* | (2020.01) |
| *G06F 30/327* | (2020.01) |
| *G06F 30/323* | (2020.01) |

(52) U.S. Cl.
CPC .............. *G06F 30/30* (2020.01); *G06F 30/20* (2020.01); *G06F 30/31* (2020.01); *G06F 30/323* (2020.01); *G06F 30/327* (2020.01)

(58) Field of Classification Search
CPC .......... G06F 30/20; G06F 30/30; G06F 30/31; G06F 30/327; G06F 30/323
USPC .................... 716/104, 139, 102, 103; 703/15
See application file for complete search history.

(56) References Cited

U.S. PATENT DOCUMENTS

| | | | | |
|---|---|---|---|---|
| 5,963,727 | A | * | 10/1999 | Shih ........................ G06F 30/30 716/102 |
| 6,275,976 | B1 | * | 8/2001 | Scandura ............ G06F 11/3608 714/E11.208 |

(Continued)

OTHER PUBLICATIONS

Xilinx, Inc., SIMS,Tara, Xilinx Unveils Revolutionary Adaptable Computing Product Category, Mar. 19, 2018, 2018 Press Release, No. 1808, No. AAB851, 3 pages, San Jose, CA, USA [online], [retrieved on Feb. 15, 2019]. Retrieved from the Internet <https://www.xilinx.com/news/press/2018/xilinx-unveils-revolutionary-adaptable-computing-product-category.html>.

(Continued)

*Primary Examiner* — Phallaka Kik
(74) *Attorney, Agent, or Firm* — Craige Thompson; Thompson Patent Law

(57) ABSTRACT

Apparatus and associated methods relate to controlling synthesis of an electronic design by tagging an intellectual property (IP) parameter such that changes to the tagged design parameter do not result in the entire electronic design being re-synthesized. In an illustrative example, a circuit may contain a number of hard blocks, which may be configured using an HDL design tool. Whenever an IP parameter of an HDL design is updated, place and route may go out of date, which may require the entire design to be re-synthesized. By tagging certain IP parameters with at least one tag, changes or alterations to these tagged IP parameters will not cause synthesis to occur (for output products associated with the at least one tag). Avoiding re-synthesis may save significant time for designers by performing re-synthesis only when necessary.

20 Claims, 7 Drawing Sheets

(56) References Cited

U.S. PATENT DOCUMENTS

| | | | | |
|---|---|---|---|---|
| 7,168,041 | B1* | 1/2007 | Durrill | G06F 30/33 715/700 |
| 2016/0141954 | A1* | 5/2016 | Kelly | H02M 1/36 323/234 |
| 2016/0179084 | A1* | 6/2016 | Suzuki | G05B 19/408 700/98 |
| 2019/0286763 | A1* | 9/2019 | Kastner | G06F 30/33 |

OTHER PUBLICATIONS

Xilinx, Inc., Vivado Design Hub—Using IP Integrator, 3 pages, San Jose, CA, USA, n.d. [online], [retrieved on Feb. 15, 2019]. Retrieved from the Internet <https://www.xilinx.com/support/documentation-navigation/design-hubs/dh0009-vivado-using-ip-integrator-hub.html>.

Xilinx, Inc., Vivado Design Suite—HLx Editions, 3 pages, San Jose, CA, USA, n.d. [online], [retrieved on Feb. 15, 2019]. Retrieved from the Internet <https://www.xilinx.com/products/design-tools/vivado.html>.

Xilinx, Inc., Vivado Design Suite User Guide: Synthesis, UG901 (v2014.1), May 1, 2014, pp. 1-161, San Jose, CA, USA, [online], [retrieved on Feb. 15, 2019]. Retrieved from the Internet <https://www.xilinx.com/support/documentation/sw_manuals/xilinx2014_1/ug901-vivado-synthesis.pdf>.

Xilinx, Inc., Programmable Abstractions, 5 pages, San Jose, CA, USA, n.d. [online], [retrieved on Feb. 15, 2019]. Retrieved from the Internet <https://www.xilinx.com/products/design-tools/all-programmable-abstractions.html>.

Xilinx, Inc., Zynq UltraScale+ MPSoC Processing System v3.1: LogiCORE IP Product Guide, PG201, Oct. 4, 2017, pp. 1-200, San Jose, CA, USA [online], [retrieved on Feb. 15, 2019]. Retrieved from the Internet <https://www.xilinx.com/support/documentation/ip_documentation/zynq_ultra_ps_e/v3_1/pg201-zynq-ultrascale-plus-processing-system.pdf>.

Xilinx, Inc., Implementation Overview for FPGAs, 3 pages, San Jose, CA, USA, n.d. [online], [retrieved on Feb. 15, 2019]. Retrieved from the Internet <https://www.xilinx.com/support/documentation/sw_manuals/xilinx11/ise_c_implement_fpga_design.htm>.

Accellera Systems Initiative, IP-XACT User Guide, Accellera IP-XACT Working Group, Mar. 2018, pp. 1-60, [online], [retrieved on Feb. 15, 2019]. Retrieved from the Internet <https://accellera.org/images/downloads/standards/ip-xact/IP-XACT_User_Guide_2018-02-16.pdf>.

* cited by examiner

```
<spirit:parameter>
    <spirit:name>PS_USB3_PERIPHERAL_ENABLE<spirit:name>
    <spirit:displayName>USB</spirit:displayName>
    <spirit:value spirit:format="long" spirit:resolve="user"
    spirit:id="PARAM_VALUE.PS_USB3_PERIPHERAL_ENABLE"
    spirit:choiceRef="choice_pairs_4873554b">0</spirit:value>
    <spirit:vendorExtensions>
        <xilinx:parameterInfo>
            <xilinx:parameterUsage>hw_handoff</xilinx:parameterUsage>
        </xilinx:parameterInfo>
    </spirit:vendorExtensions>
</spirit:parameter>
```

FIG. 3

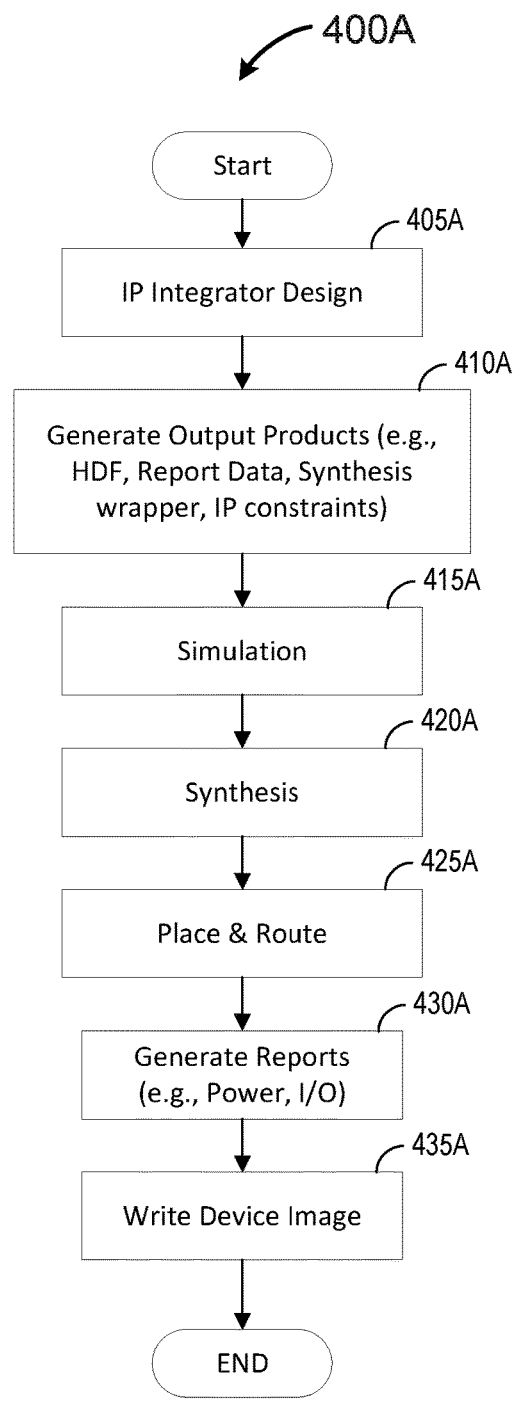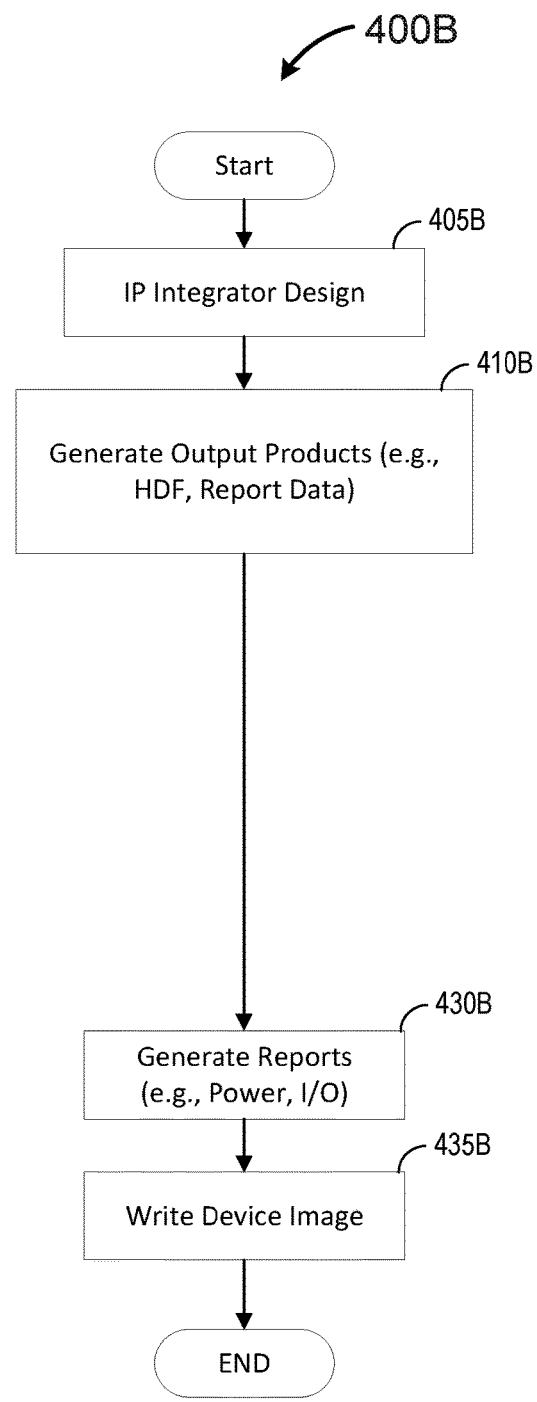
FIG. 4A
(prior art)
FIG. 4B

SELECTIVELY BYPASSING DESIGN PROCESS STEPS FOR A REGISTER-TRANSFER LOGIC (RTL) DESIGN IN AN ELECTRONIC DESIGN AUTOMATION (EDA) DEVELOPMENT ENVIRONMENT

TECHNICAL FIELD

Various embodiments relate generally to electronic design automation (EDA).

BACKGROUND

The field of electronic design automation (EDA) involves using computers and software in the design of electronic systems, such as integrated circuits, printed circuit boards, and field-programmable gate arrays (FPGAs), for example. A hardware description language (HDL) may be used in an EDA process to define the specific implementational details of an electronic circuit layout, which may include digital logic gates, for example. Logic synthesis is a process whereby a set of design parameters and instructions are translated into an actual design implementation of a physical circuit. Register-transfer level (RTL) design may be used in HDL to assemble a high-level representation of a circuit design, which may be translated into an actual physical circuit implementation. Various software tools may be used for analysis and synthesis in EDA. For example, the Vivado® Design Suite is a software suite produced by Xilinx, Inc. (headquartered in San Jose, Calif.) for the synthesis and analysis of HDL designs.

Semiconductor intellectual property cores ("IP cores" or "IP blocks") are reusable units of logic, cell, or integrated circuit layout design that can be used as building blocks within application-specific integrated circuit (ASIC) designs or field-programmable gate array (FPGA) logic designs. "Soft" IP cores may be typically offered as synthesizable RTL, where synthesizable cores may be delivered in a hardware description language such as Verilog or VHDL. "Hard" IP cores are defined as IP cores that cannot be modified and are thus "hard."

SUMMARY

Apparatus and associated methods relate to controlling synthesis of an electronic design by tagging an intellectual property (IP) parameter such that changes to the tagged design parameter do not result in the entire electronic design being re-synthesized. In an illustrative example, a circuit may contain a number of hard blocks, which may be configured using an HDL design tool. Whenever an IP parameter of an HDL design is updated, place and route may go out of date, which may require the entire design to be re-synthesized. By tagging certain IP parameters with at least one tag, changes or alterations to these tagged IP parameters will not cause synthesis to occur (for output products associated with the at least one tag). Avoiding re-synthesis may save significant time for designers by performing re-synthesis only when necessary.

Various embodiments may achieve one or more advantages. For example, some embodiments may give a user the choice of which design parameters are tagged with the "no-stale" tag. Some embodiments may advantageously provide a user ("IP developer") with granular, user-defined control over which output products are affected. Some examples may automatically determine whether re-synthesis is appropriate/necessary without requiring additional user input. Various implementations may be used regardless of whether the design is for hard blocks, an application-specific integrated circuit (ASIC), or a field-programmable gate array (FPGA). Substantial computing time and energy may be saved by only performing re-synthesis when it is absolutely necessary. Some examples may forego unnecessary steps in writing a device image, thus allowing for fewer parameter modification steps. In various implementations, a system may provide a user extension that allows for tagging parameters that do not affect register transfer level (RTL) parameters. Some aspects may halt regeneration of synthesis for software only parameters (or overlapping hardware and software parameters), while still performing re-synthesis for hardware parameters. Various examples may allow for exporting of the hardware design separate from software implementation, such that the software and hardware development may be done in parallel, beneficially saving significant time and increasing efficiency for IP developers. For example, a user may hand off the design of a hardware part, and continue working themselves on the programmable logic side of the design, without that work affecting the hardware development side of design. In various embodiments, only portions of a circuit design may go out of date, without the entire design having to be re-synthesized/regenerated. Accordingly, a development environment may provide the user with a "design clock" UI powered by a state management engine that indicates to the user (through the UI) which aspects of the design are out of date (stale), and which aspects are up to date (fresh).

Various implementations may provide a generic infrastructure for IP developers to categorize the IP parameters, where all IPs can make use of this generic infrastructure, for example. Various flows may address handling staleness and re-generation of targets. Some examples may be easily scalable for any other parameter categorizations. In various examples, the same infrastructure may be used for tagging certain IP parameters as simulation-only parameters. Various implementations may beneficially save significant time for customers who do software development on a variety of devices (e.g., hard block and/or soft block devices). For some next-generation computing devices, various embodiments may provide significant utility, as there may be many hard blocks and in addition to a hardware definition file (HDF). In various examples, a programmable device image (PDI), which may be a boot image containing configuration data used during the booting of a target device, may also need to be regenerated as it contains hard blocks configuration which is read by a platform management controller (PMC) to configure the hard blocks.

Various embodiments may relate to a circuit for selectively avoiding design process steps for a register-transfer logic (RTL) design in an electronic design automation (EDA) development environment. The circuit configured to perform operations. These operations may include tagging, via a user using a user interface (UI), a circuit parameter in a set of circuit parameters with a design process tag in a plurality of design process tags, each design process tag being associated with a corresponding design process step in a plurality of design process steps. The operations may include receiving, by a state management engine, tagging information associated with the tagged circuit parameter in the set of circuit parameters. The operations may include determining, by the state management engine, whether alterations have been made to the tagged circuit parameter. In some examples, if alterations have been made to the tagged circuit parameter, then an operation may be performed of determining, by the state management engine, whether the tagged circuit parameter is fresh or stale for the associated design process step based on the design process tag. If the tagged circuit parameter is determined to be fresh for the associated design process, then an operation may be performed of bypassing the associated design process before writing a device image. If the tagged circuit parameter is determined to be stale for the associated design process, then an operation may be performed of executing the associated design process when writing the device image.

In various embodiments, the design process tag may classify the tagged circuit parameter as one of a software-only parameter, a hardware-only parameter, or a hardware and software parameter. In some examples, if the design process tag classifies the tagged circuit parameter as one of a software-only parameter or a hardware and software parameter, and alterations have been made to the tagged circuit parameter, then hardware definition file (HDF) may be regenerated.

In some embodiments, if the design process tag classifies the tagged circuit parameter as one of a software-only parameter or a hardware and software parameter, and alterations have been made to the tagged circuit parameter, then a power report may be regenerated. In some examples, if the design process tag classifies the tagged circuit parameter as one of a software-only parameter or a hardware and software parameter, and alterations have been made to the tagged circuit parameter, then an input/output (I/O) report may be regenerated. In various implementations, if the design process tag classifies the tagged circuit parameter as one of a software-only parameter or a hardware and software parameter, and alterations have been made to the tagged circuit parameter, then WebTalk data may be updated.

A step may be performed, in some examples, of storing an association between the design process tag and the tagged circuit parameter in a tag-parameter associations database. Various implementations may write the device image to a target device to configure the target device in accordance with the set of circuit parameters. Various implementations may receive user input, via the UI, that alters at least one circuit parameter in the set of circuit parameters. In some examples, the plurality of design process steps may include at least one of: design simulation, design synthesis, design implementation, hardware definition file generation, power report generation, input/output (I/O) report generation, and/or WebTalk data generation. A step of clearing the design process tag after writing the device image may be performed in various examples.

Various embodiments may relate to a computer-implemented method for selectively avoiding design process steps for a register-transfer logic (RTL) design in an electronic design automation (EDA) development environment. Steps of the method may include tagging, via a user using a user interface (UI), a circuit parameter in a set of circuit parameters with a design process tag in a plurality of design process tags, each design process tag being associated with a corresponding design process step in a plurality of design process steps. Steps of the method may include receiving, by a state management engine, tagging information associated with the tagged circuit parameter in the set of circuit parameters. Steps of the method may include determining, by the state management engine, whether alterations have been made to the tagged circuit parameter. If alterations have been made to the tagged circuit parameter, then a step may be performed of determining, by the state management engine, whether the tagged circuit parameter is fresh or stale for the associated design process step based on the design process tag. If the tagged circuit parameter is determined to be fresh for the associated design process, then a step may be performed of bypassing the associated design process before writing a device image. If the tagged circuit parameter is determined to be stale for the associated design process, then a step may be performed of executing the associated design process when writing the device image.

In various examples, the design process tag may classify the tagged circuit parameter as one of a software-only parameter, a hardware-only parameter, or a hardware and software parameter. In some implementations, the plurality of design process steps may include at least one of design simulation, design synthesis, design implementation, hardware definition file (HDF) generation, power report generation, input/output (I/O) report generation, and/or WebTalk data generation.

In some embodiments, if the design process tag classifies the tagged circuit parameter as one of a software-only parameter or a hardware and software parameter, and alterations have been made to the tagged circuit parameter, then a power report may be regenerated. In some examples, if the design process tag classifies the tagged circuit parameter as one of a software-only parameter or a hardware and software parameter, and alterations have been made to the tagged circuit parameter, then an input/output (I/O) report may be regenerated. In various implementations, if the design process tag classifies the tagged circuit parameter as one of a software-only parameter or a hardware and software parameter, and alterations have been made to the tagged circuit parameter, then WebTalk data may be updated.

The method may include, for example, the step of writing the device image to a target device to configure the target device in accordance with the set of circuit parameters. The method may include, in some embodiments, receiving user input, via the UI, that alters at least one circuit parameter in the set of circuit parameters. The method may include, in various implementations, clearing the design process tag after writing the device image.

The details of various embodiments are set forth in the accompanying drawings and the description below. Other features and advantages will be apparent from the description and drawings, and from the claims.

BRIEF DESCRIPTION OF THE DRAWINGS

FIG. 3 depicts an exemplary intellectual property (IP) parameter tag implemented in an IP-XACT XML file.

FIG. 4A depicts an exemplary conventional process flow for electronic system design.

FIG. 4B depicts an exemplary improved process flow for electronic system design that utilizes tagging to avoid unnecessary simulation, synthesis, and place and route.

Like reference symbols in the various drawings indicate like elements.

DETAILED DESCRIPTION OF ILLUSTRATIVE EMBODIMENTS

Figure 1:
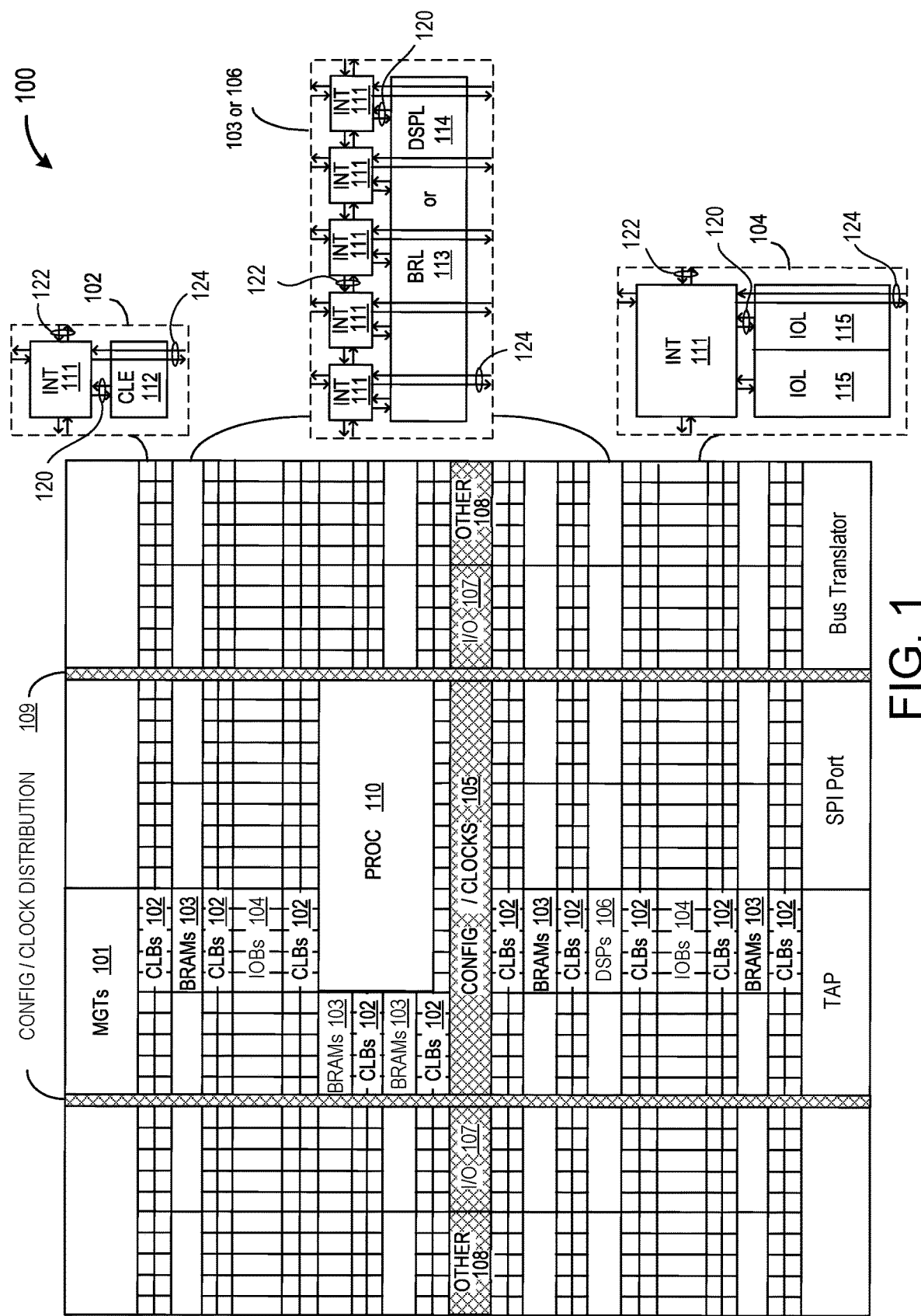
FIG. 1 depicts an exemplary programmable integrated circuit (IC) on which the disclosed apparatuses and methods may be implemented.

To aid understanding, this document is organized as follows. First, an exemplary platform (e.g., a field-programmable gate array (FPGA)) suitable to perform dynamic bypassing of design process steps using a tag management system is briefly introduced with reference to FIG. 1. Second, with reference to FIGS. 2A and 2B, the discussion turns to exemplary embodiments that illustrate bypassing design process steps in a programmable fabric (such as an FPGA) and an application-specific integrated circuit (ASIC), respectively. Third, with reference to FIG. 3, an exemplary XML file snippet is illustrated that shows tagging of a circuit parameter with a design process tag. Fourth, with reference to FIGS. 4A and 4B, an exemplary conventional design process (4A) is compared with an exemplary design process bypass method (4B). Finally, with reference to FIG. 5, an exemplary method for bypassing various design processes using design process tags and a state monitoring engine is disclosed. Some embodiments may advantageously provide a user ("IP developer") with granular, user-defined control over which output products are affected. Some examples may automatically determine whether re-synthesis is appropriate/necessary without requiring additional user input. Various examples may allow for exporting of the hardware design separate from software implementation, such that the software and hardware development may be done in parallel.

Various integrated circuit systems may contain a number of hard blocks that may contain acceleration processing units (APUs), real-time processing units (RPU), and/or double-data rate (DDR) memory, for example. For example, a target device may be a highly integrated multi-core heterogeneous compute platform that can be changed at the hardware level to adapt to the needs of a wide range of applications and workloads. A target device may include an FPGA fabric with distributed memory and hardware-programmable DSP blocks, a multicore system-on-a-chip (SoC), one or more software programmable, yet hardware adaptable, compute engines, all connected through a network on chip (NoC), and highly integrated programmable I/O functionality. A target device may have a number of hard blocks, such as, for example, an application processing unit (APU), a real-time processing unit (RPU), double data rate (DDR) memory, and cached peripheral component interconnect (PCI) modules. The various hard blocks of a target device may be configured by a processing system configuration wizard (PCW) by setting the parameters in the processing system/platform management controller (PS/PMC) intellectual property (IP). For example, a user (an "IP developer") may instantiate the IP parameters using a graphical user interface (GUI) provided by an EDA software tool. Whenever IP parameters change, place and route may typically go out of date (because the system may assume that the netlist has been changed/altered, for example). Therefore, even for small software related changes, it may still be necessary for conventional systems to run an entire implementation tool flow (e.g., simulation, synthesis, and place and route), which may significantly slow down configuration time for a target device.

For example, when a user is typically interfacing with an EDA software program, if the user makes any changes to the hard block IP parameters (e.g., CPM, PS, Sysmon), irrespective of if those parameters affect existing pre-synthesized programmable logic (PL), such changes may cause the system to re-synthesize. Sysmon refers to a System Monitor, which may be a block inside of an FPGA to measure the temperature and voltage of the various blocks in the chip. CPM means a Cached PCIe (peripheral component interconnect express) Module, which may be a block in a target device where Cache Coherent Interconnect for Accelerators (CCIX) is used along with PCIe. An IP wrapper may possess many parameters that do not in any way affect the interface to programmable logic, yet a change in any of these parameters may trigger re-synthesis for a conventional design flow. For an IP block like the PS/PMC, such re-synthesis may be undesirable, as re-synthesis may cause unnecessary delay and frustration with users working with EDA software.

For some target devices, where the capacity for larger designs is inherent, this unnecessary slowdown in operations may (e.g., for simple projects with very little IP in the PL) cause several minute delays. For projects with high utilization of PL resources, re-synthesis can take hours. For some devices, changes to parameters which do not affect the register-transfer-logic (RTL) will not put the implementation of the design out of date. There are many parameters which may cause only the software register programming to change (while the hardware design does not change). Because the RTL of hard block never changes, synthesis, place and route may not need to be re-run when an IP parameter of the hard block is changed/altered. Accordingly, various embodiments may facilitate selective tagging of such parameters in the IP, such that the tags will not make synthesis place and route stale for a tagged IP parameter. Put another way, various embodiments may provide a capability with EDA tools where the user can explicitly define which IP parameters (or any circuit design parameter) will not affect RTL. For example, changes to tagged parameters may only cause a hardware definition file (HDF) to go stale, while other output products maintain their freshness. Such tagging may beneficially result in significant time savings for various users of electronic design automation (EDA) software, by avoiding simulation, synthesis, and/or implementation when these steps are not required.

Various implementations may provide a mechanism to categorize the IP parameters, and IP developers may tag these parameters as software parameters at the IP packaging time. A user may tag a parameter with a tag that is associated with a (subset) of different output products (e.g., simulation files, synthesis files, hardware handoff files), such that the tags specify which one (or more) of the output products would be affected if that parameter is changed/altered during development. For example, a user may apply a tag to a parameter to indicate that only this tagged parameter affects the I/O report. A parameter may have multiple tags assigned to it. Once a given parameter is tagged, EDA software flows may automatically take care of avoiding regeneration of synthesis, place and route, bitstream, and guides, to regenerate the software register configuration. Various implementations may be used in different types of target devices, which may have many hard blocks and may require HDF to be regenerated when software parameters are changed. Various implementation may run implementation tools intelligently, whereby only parameters that affect the PL should cause EDA software to re-synthesize, place and route when updating the hard block settings. Such intelligence may be provided by the IP, whereby a user can specify (tag) which parameters affect PL logic. The infrastructure may be generic and may be used for developing and preventing other long running processes.

As IP is tagging parameters for categorization, this tag information may be available in an HDF. This tagging information may be used to provide the configuration of software only parameters in a FPGA application development tool. This tool may (internally) use a hardware software interface (HIS), which may be a tool used for generating the hardware information exported to the software (HDF), to get the details of software only parameters and run a PCW to validate the parameters configuration and generate software register programming files. Various implementations may also provide infrastructure to bring these configured software parameters in SDx to an EDA software suite. The user may leverage an IP Packager tool provided in a development environment GUI, which may take a developers RTL design and wrap it up. A state management system/engine may keep track of tags, parameters, and staleness/freshness, such that if the state management engine determines there are no changes that affect RTL, then the output products are determined to be up to date (fresh).

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

In various implementations, a device similar to (or having components similar to) the programmable IC 100 of FIG. 1 may be designed, programmed, and/or configured using EDA software that utilizes tagging to avoid (re-)synthesis when IP parameters (that are tagged as not affecting PL) are modified. For example, a user may utilize an EDA software program to design an IC 100, where some of the IP parameters of the design are selectively tagged (e.g., by the user in a development environment). Through selective tagging certain IP parameters, a chip designer may avoid time-consuming (re-)simulation, (re-)synthesis, and (re-)implementation, beneficially saving the chip and software designers time and conserving computing resources. Accordingly, various embodiments may allow implementation tools to run intelligently, whereby only parameters that affect the PL will cause an EDA design to re-synthesize.

Figure 2A:
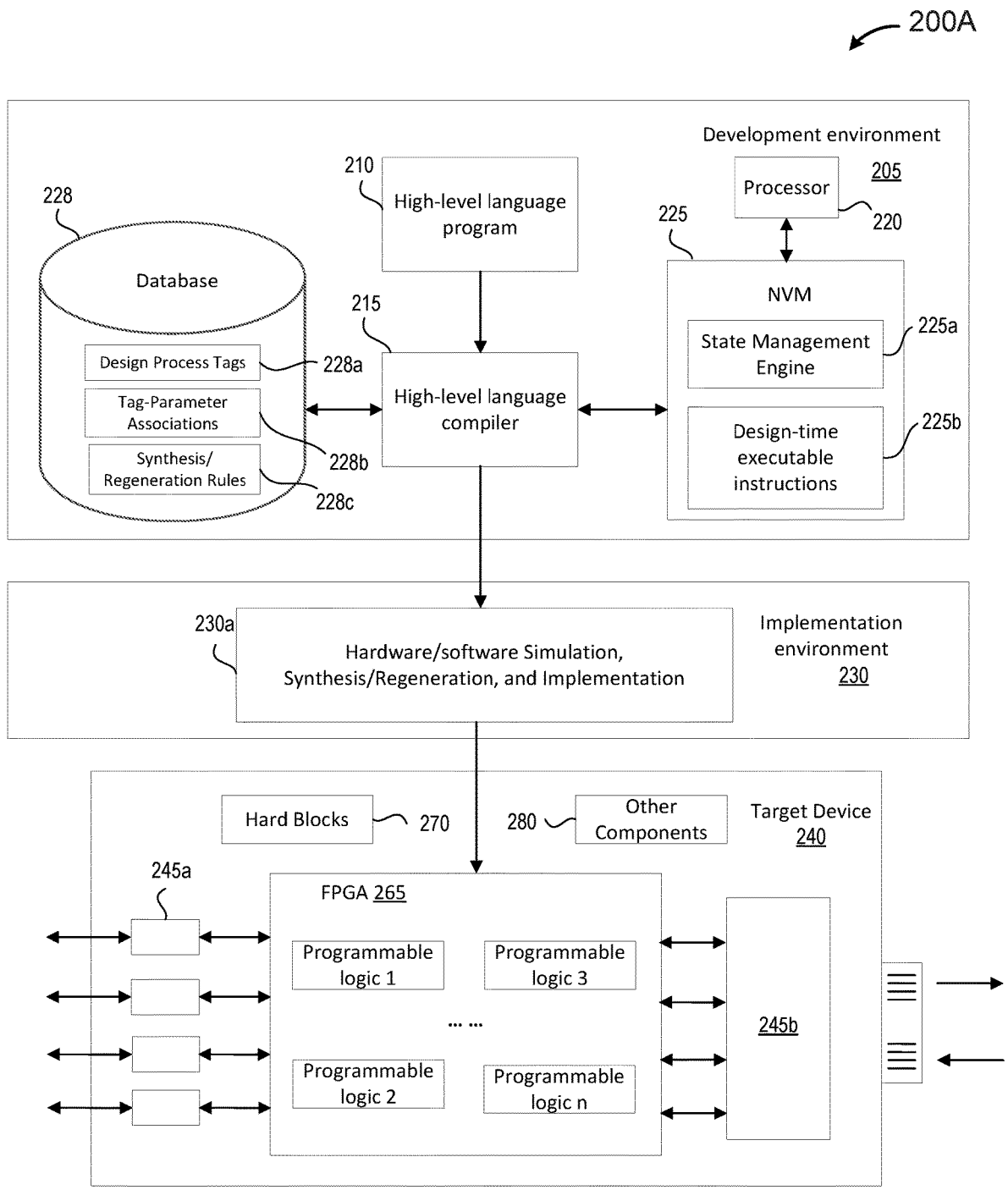
FIG. 2A depicts a block diagram of an exemplary system including a development environment, an implementation environment, and a target device, the system implementing bypassing of various circuit design steps in a field programmable gate array (FPGA) device.

FIG. 2A depicts a block diagram of an exemplary system including a development environment, an implementation environment, and target device, the system implementing bypassing of various circuit design steps in a field programmable gate array (FPGA) device. A system 200A includes a development environment 205. The development environment 205 may be a software suite (such as the Vivado®

Suite distributed by Xilinx, Inc) including a number of tools for performing EDA design. The environment 205 includes a high-level language program 210, such as HDL code, that is used for designing hardware systems. The program 210 may be compiled by a high-level language compiler 215.

The environment 205 may be running on a processor 220 operably coupled to non-volatile memory (NVM) 225. NVM 225 contains instructions, that when executed by the processor 220, cause the processor to perform operations that enable the various tools and functionality of the environment 205. For example, the NVM 225 may include design-time executable instructions that perform various operations involving EDA design. The NVM 225 may also include a state management engine 225a that monitors the staleness/freshness of various circuit parameters used during a design-time process. For example, the state management engine may keep track of which circuit parameters have been updated/altered/changed, may identify circuit parameters that have been tagged with various design process tags, and may execute or bypass various design process steps based on the alterations and tags. In various examples, the state management engine 225a may be software/executable code configured to run on a processor and memory, on an ASIC, or on an FPGA. NVM 225b also may include design-time executable instructions 225b that includes various programs, routines, and/or operations that are executed during design time for a target device (e.g., when the target device is being configured/set up).

The environment 205 also includes at least one database 228. The database 228 includes various data used in a design step bypassing method. For example, the database may include a list of design process tags 228a that may be applied (tagged) to various circuit design parameters (IP parameters). The database may include, in some embodiments, tag-parameter associations 228b that map specific circuit design parameters to various design process tags. The database may also include, for example, various synthesis/regeneration rules 228c that determine when the system 200A will either execute or bypass a specific circuit design step.

The system 200A includes an implementation environment 230. In some examples, the implementation environment 230 may be packaged with the development environment 205. The implementation environment 230 includes various tools 230a for hardware and/or software simulation, synthesis/regeneration, and/or implementation (e.g., place and route). As an illustrative example, the environment 205 may have an HDL program 210, compile the program 210 using the compiler 215, and then simulate, synthesize, and/or implement the compiled program in the environment 230. After the environment 230 implements the design, the implementation may be loaded onto a target device 240.

A target device 240 may, for example, be a system on a chip (SoC) that includes various components, at least one among them being an FPGA 265. The FPGA 265 may be programmed/configured "on-the-fly" by taking a bitstream of the implementation generated by environments 205 and 230, and writing the bitstream into programmable logic (PL) of the FPGA 265. The device 240 may include hard blocks 270, which may be immutable hardware. Examples of hard blocks 270 may include acceleration processing units (APUs), real-time processing units (RPU), and/or double-data rate (DDR) memory. The device 240 may also include other components 280, such as signal processing circuitry/IP, networking circuitry/IP, and system controllers, for example. An example of a target device 240 utilized in the depicted embodiment may be a device in the "Everest" product family offered by Xilinx, Inc.

The device 240 includes a number of buffers 245a (e.g., which may form an I/O interface) that connect external signals into the FPGA 265. In the depicted example, the FPGA 265 includes n programmable logic blocks that represent programmable hardware resources available to realize circuitry in accordance with the design specified by, for example, the user-input high level language programming in the development environment 205. The FPGA 265 also connects with other devices 245b, which may provide a variety of auxiliary functions.

Figure 2B:
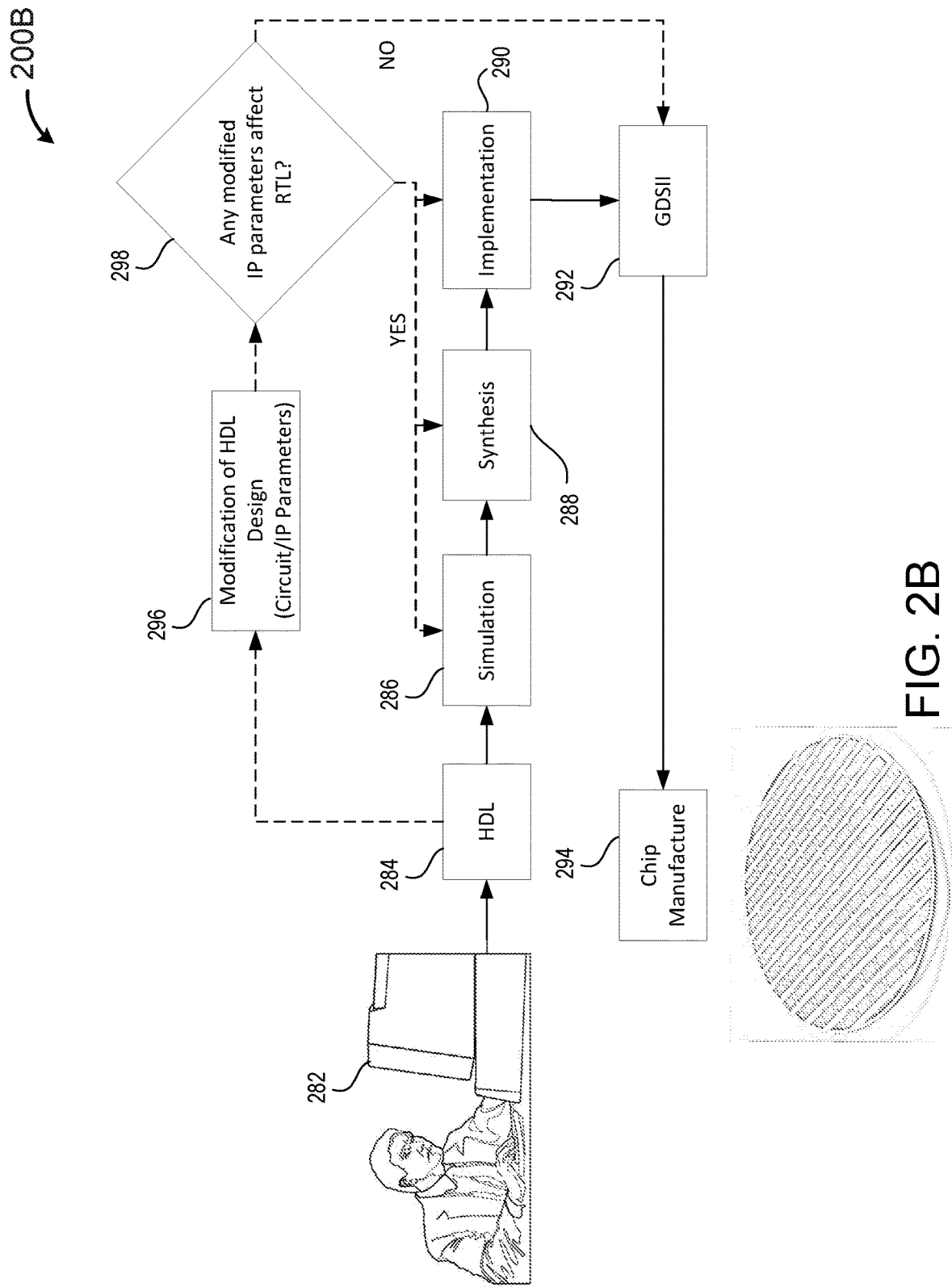
FIG. 2B depicts a flowchart of an exemplary circuit design step bypassing process as applied in a hard block and/or application specific integrated circuit (ASIC) design.

FIG. 2B depicts a flowchart of an exemplary circuit design step bypassing process as applied in a hard block and/or application specific integrated circuit (ASIC) design. An ASIC design process flow 200B begins with a hardware developer using a computer 282 to design a piece of hardware. The developer designs hardware by producing HDL code 284. In a typical flow, the developer may simulate 286 the HDL code to verify that the code works as intended. Next, the developer may synthesize 288 the HDL code. After synthesis 288, the developer may then implement 290 the synthesized code (e.g., perform placement and routing operations to determine the layout of a hardware design). Next, the implementation may be transformed into GDSII file format 292. The GDSII file format 292 may then be sent to a foundry for final chip manufacture 294.

In an adjusted flow in accordance with various embodiments disclosed herein, the developer may decide to modify 296 at least some aspect of the HDL design (e.g., by changing circuit/IP parameters). A state management engine (e.g., within 225 in FIG. 2A) may then perform checking operations to determine whether any of the modified design parameters affect RTL (at step 298). If the modifications do affect RTL ("YES"), then at least one of simulation 286, synthesis 288, and/or implementation 290 will be re-executed. If the modification do not affect RTL ("NO"), then simulation 286, synthesis 288, and implementation 290 may instead be bypassed, and the flow may go directly to generating the GDSII file 292. In this sense, various apparatuses and methods disclosed herein may bypass unnecessary circuit design steps, advantageously (1) saving valuable developer time, and (2) making more efficient use of computing power.

FIG. 3 depicts an exemplary intellectual property (IP) parameter tag implemented in an IP-XACT XML file. An extensible markup language (XML) code snippet 300 is shown that defines an IP parameter. In this case, the XML code snippet is in IP-XACT format, which is an XML format that defines and describes individual re-usable electronic circuit designs (e.g., individual pieces of "IP"). In this specific example, the name 305 of the parameter is "PS-USB3_PERIPHERAL_ENALE." The parameter is tagged with a tag 310, which indicates which output products become stale upon a change in the specific parameter. In this case, a vendor-specific extension on the user parameters called "parameterUsage" is shown in the embodiment of FIG. 3. This tag indicates that when the tagged parameter is changed/updated/altered, only the hardware handoff target ("hw_handoff" 315) gets stale. When the parameter is not marked with parameterUsage information, a system may interpret the lack of tagging (the "default" state) as putting the synthesis (and other targets) to go stale (meaning all output products will go out of date and everything will need to be regenerated). An IP developer may specify (using the XML code in IP-XACT format) which parameters are "software only" parameters. Accordingly, by carefully marking the parameters which do not affect the RTL, an IP developer can avoid running the implementation tools, thus saving valuable time and computing resources.

FIG. 4A depicts an exemplary conventional process flow for electronic system design. A conventional flow 400A begins with an IP developer using an IP Integrator tool for making changes or updates to an IP integrator design in step 405A. For example, an IP integrator tool may be used by a developer for instantiating and interconnecting IP cores from an IP catalog onto a design canvas. The developer may modify designs interactively through a GUI, or programmatically using a Tcl programming interface, for example. Next, at step 410A, the system generates various output products, such as a hardware definition file (HDF), report data, synthesis wrapper, and IP constraints file, for example. Next, the developer simulates their design in the development environment at step 415A. The developer then synthesizes their design at step 420A. Next, the synthesized design is then implemented by running place and route algorithms. For smaller designs, the synthesis, place and route may take only a few minutes, while for larger designs, the synthesis, place and route may take hours (or even days). Next, the system generates various reports (e.g., Power and I/O reports). The system then writes the finalized design to a device (which may be an FPGA, for example). Accordingly, a conventional flow 400A may need to perform simulation 415A, synthesis 420A, and place and route 425A even for minor updates to a circuit design.

FIG. 4B depicts an exemplary improved process flow for electronic system design that utilizes tagging to avoid unnecessary simulation, synthesis, and place and route. An improved flow 400B begins with an IP developer using an IP Integrator tool for making changes or updates to an IP integrator design in step 405B. Next, at step 410A, the system generates various output products, such as a hardware definition file (HDF) and report data, for example. Notably, in the flow 400B, various output products are not (re-)generated, such as the synthesis wrapper and IP constraints file. These output products are not (re-)generated by virtue of IP parameters being tagged to indicate bypassing the generation of these output products (because they were altered, but did not affect RTL). In the same vein, all three of simulation, synthesis, and place and route are also bypassed, as the system recognizes (using the state management engine) that only tagged parameters have changed, and therefore, should not be regenerated. Accordingly, process 400B may skip the time-consuming steps 415A-425A of flow 400A, and go straight to the steps 430B and 435B, advantageously saving precious time and computing power for the IP developer.

Figure 5:
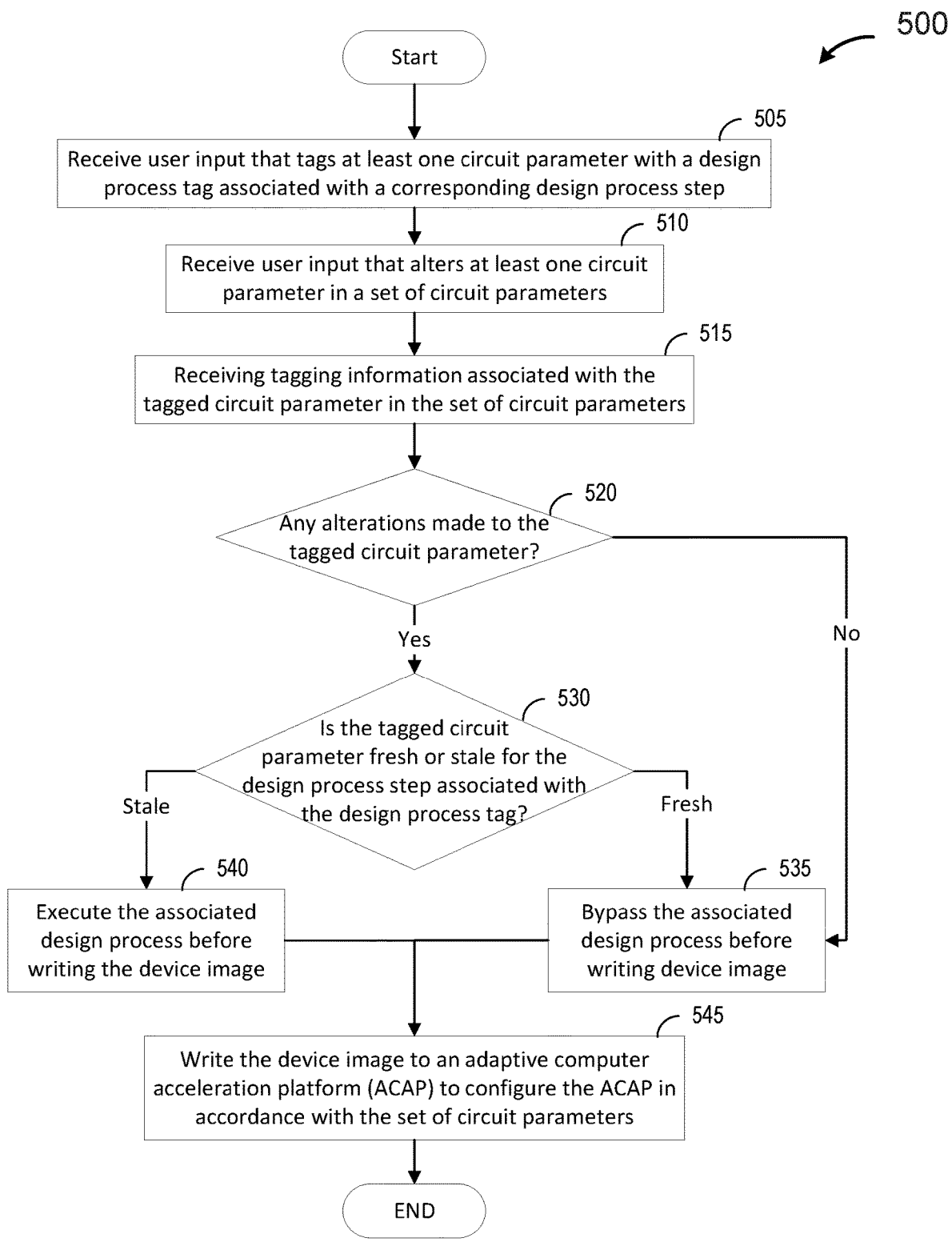
FIG. 5 depicts an exemplary method for tagging circuit design parameters, determining which parameters have been updated/altered, and determining whether to bypass or execute a specific design process based on the tagging/alterations.

FIG. 5 depicts an exemplary method for tagging circuit design parameters, determining which parameters have been updated/altered, and determining whether to bypass or execute a specific design process based on the tagging/alterations. A method 500 starts at step 505 with a system (such as a development environment(s) 205, 240 from FIG. 2A) receiving user input that tags at least one circuit parameter with a design process tag that is associated with a corresponding design process step. Next, at step 510, the system receives user input that alters, changes, or otherwise modifies at least one circuit parameter in a set of circuit parameters. Next, at step 515, the system receives tagging information associated with the tagged circuit parameter in the set of circuit parameters. This tagging information may include the XML code snippet exemplified in FIG. 3, for example.

Next, the system may logically determine whether any alterations have been made to the tagged circuit parameter (at step 520). If there are no alterations, then the system bypasses the associated design process at step 535 (as re-simulation, re-synthesis, and re-implementation are not required). If there are alterations, then the system logically determines whether the tagged circuit parameter is fresh or stale for the design process step associated with the design process tag. For example, a circuit parameter may be tagged with a "hardware handoff" tag, but not a "simulation" tag. For such a tagged circuit parameter, the system may determine that a hw_handoff output product needs to be regenerated (as the tagged parameter is determined to be stale for hardware handoff), but that the simulation output product does not need to be regenerated (as the tagged parameter is determined to be fresh for simulation). If the tagged circuit parameter is determined to be fresh for the corresponding design process step, then the system bypasses that corresponding design process step (at step 535), beneficially saving the IP developer time and computing power that can be better spent elsewhere. If the tagged circuit parameter is determined to be stale for the corresponding design process step, then the system executes the corresponding design process step (at step 540), because the RTL is affected, and so the associated output product needs to be regenerated. In a last step 545, the system writes the device image to an target device to configure the device in accordance with the set of circuit parameters.

Various steps disclosed in method 500 may be performed by the state management engine 225a depicted in FIG. 2A. For example, steps 515, 520, and 530 may be computing steps performed by the state management engine 225a. To illustrate, the state management engine 225a may first receive tagging information associated with a tagged circuit parameter. Once the engine 225a receives this information, it may do a logical check to determine whether any alterations or changes have been made to the tagged circuit parameter (e.g., since a most recent simulation/synthesis/implementation). Next, the engine 225a may determine whether the tagged circuit parameter is fresh or stale for the design process step associated with the design process tag. Once the engine 225a makes this determination, the engine 225a may hand off succeeding steps 535-545 to the design-time executable instructions 225b and/or the implementation environment 230 (which includes simulation, synthesis/regeneration, and implementation executables).

Figure 6:
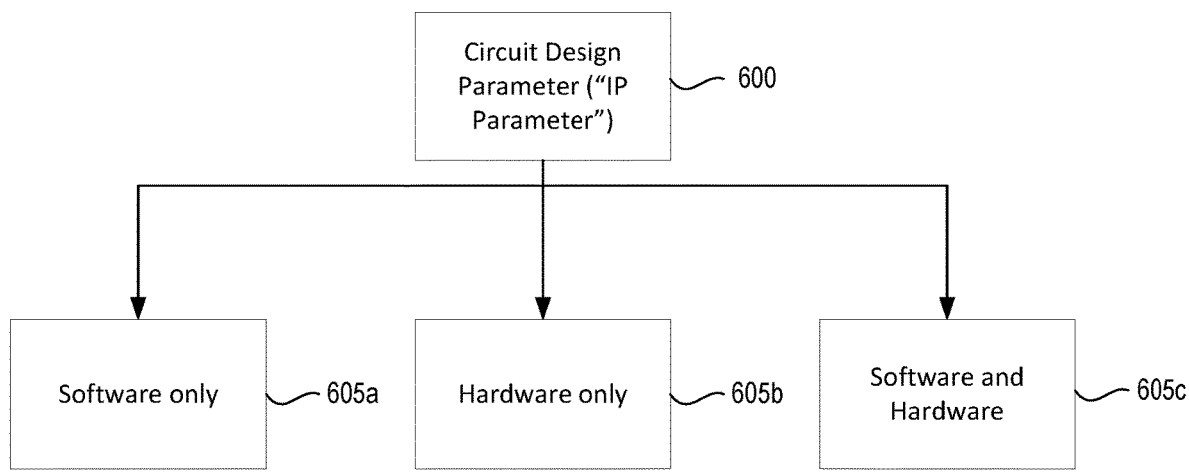
FIG. 6 depicts a block diagram view of an exemplary circuit design parameter classification into three distinct categories.

FIG. 6 depicts a block diagram view of an exemplary circuit design parameter classification into three distinct categories. Circuit design parameters ("IP parameters") can be classified into three types: (1) software only parameters, (2) hardware only parameters, and (3) hardware and software parameters.

Software Only Parameters—These parameters are software parameters and therefore only affect register programming (they may take any value, but they never affect the RTL). For example, clocking parameters related to peripherals (like QSPI, I2C) may be classified as software only parameters.

Hardware Only Parameters—These parameters are hardware parameters that affect the RTL, and so any change to these parameters must put the synthesis, place and route out of date (therefore requiring re-synthesis/regeneration). An example of a hardware only parameter is a PS-PL interface related parameter. Generally, the parameters which affect the boundary of the IP are classified as hardware parameters.

Hardware and Software Parameters—These parameters can affect the hardware depending on the value they take.

Take as an example the PS_CANO_PERIPHERAL_IO parameter. If the value of this parameter changes from MIO 2 . . . 3 to EMIO (MIO=multiplexed input/output), then the boundary of the IP changes, and hence this parameter will affect the RTL (thus requiring re-synthesis/regeneration). Similarly, if the parameter changes from EMIO to MIO 2 . . . 3, then such a change affects the boundary of the IP, and hence the RTL. But if the parameter is changed from MIO 2 . . . 3 to MIO 12 . . . 13, then there is no change to hardware (since the IP boundary is not changed). Accordingly, these parameters may affect the hardware depending on the transition of the value.

When software parameters are modified, the system will not regenerate synthesis and implementation, but certain output product will be regenerated/updated when software parameters are modified. These output products include the hardware definition file (HDF), Power and I/O reports, and WebTalk data.

HDF/PDI—HDF is a container file (like zip) that contains the files used in an FPGA application development tool. The system may generate the HDF file, which represents a description of the hardware design, but for the "software world." Therefore, HDF represents a hardware handoff ("hw_handoff") of the system to the software. The HDF includes software register configuration files and the instantiated IP configuration parameters, which may change when there is a change to software parameters. SDx may use the HDF data to create board support package and First Stage Boot Loader, which need to be regenerated when the software parameters are changed.

Power Report—The power estimation for the design may change when the software parameters are modified. For example, a user may change the clocking frequency in a circuit design, which may affect the power usage of the circuit design. Hence, the power report must be regenerated when there is a change in software parameters. The system may use the report configuration infrastructure to make the power report report stale when software parameters are changed, and update corresponding DCP with latest values while regenerating the power reports.

I/O Report—The MIO's used in the hard blocks are shown in the I/O report, and the I/O report may change because of a change in certain MIO settings. Hence, whenever the MIO configurations change (a change in software parameters), the I/O report needs to be updated. Put another way, because software parameters can affect the I/O report, the system must update the I/O report when software parameters are modified. The system may make use of report configuration infrastructure to make this report stale when software parameters are changed, and update corresponding DCP with latest values while regenerating the I/O reports.

WebTalk—Parameter usage information is available with webtalk data. Hence webtalk data must be updated when the software parameters are changed. As webtalk data may be transmitted only at write_bitstream step for the production parts, the system should not regenerate the bitstream for software parameter change. Accordingly, the system may transmit this updated data at time of exporting to SDx.

Although various embodiments have been described with reference to the figures, other embodiments are possible. For example, although various embodiments may be implemented using reconfigurable programmable logic blocks (e.g., FPGA), other embodiments may be implemented in fixed instantiations (e.g., ASIC). While dedicated hard block circuitry in an ASIC implementation may not be reconfigurable once instantiated in an integrated circuit, for example, an ASIC implementation may, in some implementations, provide for a minimized platform with respect to, for example, power consumption and/or die area. An HDF may be a container file for containing information about hardware, which is exported to embedded software tools. The embedded software tools may use the information stored in the HDF for building device drivers and the software stack. When the HDF becomes "stale," it means that a user may only need to export the HDF again, without impacting place/route and other implementation steps in the design process. The HDF can be quickly generated (unlike place and route, which can take more time).

In some embodiments, a system for selectively avoiding design process steps for a register-transfer logic (RTL) design in an electronic design automation (EDA) development environment may be implemented in a processor (e.g., processor 220) that is configured to execute a set of instructions stored in a data store to selectively avoid design process steps for a register-transfer logic (RTL) design in an electronic design automation (EDA) development environment. The processor may be arranged on an integrated circuit, which may include programmable logic in an FPGA (e.g., the FPGA 265). For example, a system using tagging for selectively bypassing design process steps in the environments 205, 230 may be implemented in a programmable logic block of a system-on-chip (SOC) and/or implemented in a hard block using fixed circuitry of the SOC.

In various implementations, some or all of the functions of a system using tagging for selectively bypassing design process steps in the environments 205, 230 may be implemented using programmable logic (e.g., FPGA 265). For example, an FPGA may be optimized for executing various operations and functions of an EDA design tool, such as simulation, synthesis, and implementation, described with reference to FIGS. 2A and 2B, for example.

In some embodiments, some or all of the functions of a system for selectively avoiding design process steps for a register-transfer logic (RTL) design in an electronic design automation (EDA) development environment may be implemented as hard block fixed circuitry. For example, an application specific integrated circuit (ASIC) may be architected specifically for the purpose of performing tagging operations for selectively bypassing various circuit design process steps, including selectively avoiding design process steps for a register-transfer logic (RTL) design in an electronic design automation (EDA) development environment.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits). In some embodiments, the processor and the memory can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. An exemplary embodiment may be implemented in a computer system that includes a graphical user interface and/or an Internet browser. To provide for interaction with a user, some implementations may be implemented on a computer having a display device, such as an LCD (liquid crystal display) monitor for displaying information to the user, a keyboard, and a pointing device, such as a mouse or a trackball by which the user can provide input to the computer.

In various implementations, the system may communicate using suitable communication methods, equipment, and techniques. For example, the system may communicate with compatible devices (e.g., devices capable of transferring data to and/or from the system) using point-to-point communication in which a message is transported directly from a source to a receiver over a dedicated physical link (e.g., fiber optic link, infrared link, ultrasonic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, FireWire, ATA/IDE, RS-232, RS-422, RS-485, 802.11 a/b/g/n, Wi-Fi, WiFi-Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. An electronic design automation (EDA) system configured to perform operations comprising:
    tagging a circuit parameter in a set of circuit parameters with a design process tag in a plurality of design process tags, each design process tag being associated with a corresponding design process step in a plurality of design process steps;
    receiving, by a state management engine, tagging information associated with the tagged circuit parameter in the set of circuit parameters;
    determining, by the state management engine, whether alterations have been made to the tagged circuit parameter;
    if alterations have been made to the tagged circuit parameter, then determining, by the state management engine, whether the tagged circuit parameter is fresh or stale for the associated design process step based on the design process tag;

if the tagged circuit parameter is determined to be fresh for the associated design process, then bypassing the associated design process before writing a device image.

2. The system of claim 1, further comprising:
if the tagged circuit parameter is determined to be stale for the associated design process, then executing the associated design process when writing the device image.

3. The system of claim 1, wherein the design process tag classifies the tagged circuit parameter as one of a software-only parameter, a hardware-only parameter, or a hardware and software parameter.

4. The system of claim 3, further comprising:
if the design process tag classifies the tagged circuit parameter as one of a software-only parameter or a hardware and software parameter, and alterations have been made to the tagged circuit parameter, then regenerating a hardware definition file (HDF).

5. The system of claim 3, further comprising:
if the design process tag classifies the tagged circuit parameter as one of a software-only parameter or a hardware and software parameter, and alterations have been made to the tagged circuit parameter, then regenerating a power report.

6. The system of claim 3, further comprising:
if the design process tag classifies the tagged circuit parameter as one of a software-only parameter or a hardware and software parameter, and alterations have been made to the tagged circuit parameter, then regenerating an input/output (I/O) report.

7. The system of claim 3, further comprising:
if the design process tag classifies the tagged circuit parameter as one of a software-only parameter or a hardware and software parameter, and alterations have been made to the tagged circuit parameter, then updating WebTalk data.

8. The system of claim 1, further comprising:
storing an association between the design process tag and the tagged circuit parameter in a tag-parameter associations database.

9. The system of claim 1, wherein the step of tagging a circuit parameter in a set of circuit parameters is performed with a user interface (UI).

10. The system of claim 1, further comprising:
receiving user input, via the UI, that alters at least one circuit parameter in the set of circuit parameters.

11. The system of claim 1, wherein the plurality of design process steps comprise:
design simulation;
design synthesis;
design implementation;
hardware definition file generation;
power report generation;
input/output (I/O) report generation; and,
WebTalk data generation.

12. The system of claim 1, further comprising:
clearing the design process tag after writing the device image.

13. A computer-implemented method comprising:
tagging a circuit parameter in a set of circuit parameters with a design process tag in a plurality of design process tags, each design process tag being associated with a corresponding design process step in a plurality of design process steps;
receiving, by a state management engine, tagging information associated with the tagged circuit parameter in the set of circuit parameters;
determining, by the state management engine, whether alterations have been made to the tagged circuit parameter;
if alterations have been made to the tagged circuit parameter, then determining, by the state management engine, whether the tagged circuit parameter is fresh or stale for the associated design process step based on the design process tag;
if the tagged circuit parameter is determined to be fresh for the associated design process, then bypassing the associated design process before writing a device image.

14. The method of claim 13, further comprising:
if the tagged circuit parameter is determined to be stale for the associated design process, then executing the associated design process when writing the device image.

15. The method of claim 13, wherein the design process tag classifies the tagged circuit parameter as one of a software-only parameter, a hardware-only parameter, or a hardware and software parameter.

16. The method of claim 13, wherein the plurality of design process steps comprise:
design simulation;
design synthesis;
design implementation;
hardware definition file (HDF) generation;
power report generation;
input/output (I/O) report generation; and,
WebTalk data generation.

17. The method of claim 16, further comprising:
if the design process tag classifies the tagged circuit parameter as one of a software-only parameter or a hardware and software parameter, and alterations have been made to the tagged circuit parameter, then regenerating a hardware definition file (HDF);
if the design process tag classifies the tagged circuit parameter as one of a software-only parameter or a hardware and software parameter, and alterations have been made to the tagged circuit parameter, then regenerating a power report;
if the design process tag classifies the tagged circuit parameter as one of a software-only parameter or a hardware and software parameter, and alterations have been made to the tagged circuit parameter, then regenerating an input/output (I/O) report; and,
if the design process tag classifies the tagged circuit parameter as one of a software-only parameter or a hardware and software parameter, and alterations have been made to the tagged circuit parameter, then updating WebTalk data.

18. The method of claim 13, wherein the step of tagging a circuit parameter in a set of circuit parameters is performed with a user interface (UI).

19. The method of claim 18, further comprising:
receiving user input, via the UI, that alters at least one circuit parameter in the set of circuit parameters.

20. The circuit of claim 13, further comprising:
clearing the design process tag after writing the device image.

* * * * *